US007184298B2

(12) United States Patent
Fazan et al.

(10) Patent No.: US 7,184,298 B2
(45) Date of Patent: Feb. 27, 2007

(54) LOW POWER PROGRAMMING TECHNIQUE FOR A FLOATING BODY MEMORY TRANSISTOR, MEMORY CELL, AND MEMORY ARRAY

(75) Inventors: Pierre Fazan, Lonay (CH); Serguei Okhonin, Lausanne (CH)

(73) Assignee: Innovative Silicon S.A., Lausanne (CH)

( * ) Notice: Subject to any disclaimer, the term of this patent is extended or adjusted under 35 U.S.C. 154(b) by 168 days.

(21) Appl. No.: 10/941,692

(22) Filed: Sep. 15, 2004

(65) Prior Publication Data

US 2005/0063224 A1 Mar. 24, 2005

Related U.S. Application Data

(60) Provisional application No. 60/505,679, filed on Sep. 24, 2003.

(51) Int. Cl.
G11C 11/24 (2006.01)
H01L 27/01 (2006.01)
(52) U.S. Cl. ...................... 365/149; 257/349
(58) Field of Classification Search ............... 365/149; 257/347, 349
See application file for complete search history.

(56) References Cited

U.S. PATENT DOCUMENTS

| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |

(Continued)

FOREIGN PATENT DOCUMENTS

EP 0 030 856 6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—Trong Phan
(74) *Attorney, Agent, or Firm*—Neil A. Steinberg

(57) ABSTRACT

There are many inventions described and illustrated herein. In one aspect, the present invention is directed to a memory cell, architecture, and/or array and/or technique of writing or programming data into the memory cell (for example, a technique to write or program a logic low or State "0" in a memory cell employing an electrically floating body transistor. In this regard, the present invention programs a logic low or State "0" in the memory cell while the electrically floating body transistor is in the "OFF" state or substantially "OFF" state (for example, when the device has no (or practically no) channel and/or channel current between the source and drain). In this way, the memory cell may be programmed whereby there is little to no current/power consumption by the electrically floating body transistor and/or from memory array having a plurality of electrically floating body transistors.

24 Claims, 10 Drawing Sheets

U.S. PATENT DOCUMENTS

| | | | |
|---|---|---|---|
| 4,979,014 A | 12/1990 | Hieda et al. | |
| 5,144,390 A | 9/1992 | Matloubian | |
| 5,258,635 A | 11/1993 | Nitayama et al. | |
| 5,388,068 A | 2/1995 | Ghoshal et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,528,062 A | 6/1996 | Hsieh et al. | |
| 5,568,356 A | 10/1996 | Schwartz | |
| 5,578,865 A * | 11/1996 | Vu et al. | 257/349 |
| 5,593,912 A | 1/1997 | Rajeevakumar | |
| 5,606,188 A | 2/1997 | Bronner et al. | |
| 5,627,092 A | 5/1997 | Alsmeier et al. | |
| 5,631,186 A | 5/1997 | Park et al. | |
| 5,696,718 A | 12/1997 | Hartmann | |
| 5,740,099 A | 4/1998 | Tanigawa | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,811,283 A | 9/1998 | Sun | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 6,018,172 A | 1/2000 | Hidada et al. | |
| 6,081,443 A | 6/2000 | Morishita | |
| 6,096,598 A | 8/2000 | Furukawa et al. | |
| 6,097,056 A | 8/2000 | Hsu et al. | |
| 6,111,778 A * | 8/2000 | MacDonald et al. | 365/149 |
| 6,121,077 A | 9/2000 | Hu et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,708 B1 | 1/2001 | Kuang et al. | |
| 6,214,694 B1 | 4/2001 | Leobandung et al. | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,407,427 B1 * | 6/2002 | Oh | 257/347 |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,538,916 B2 | 3/2003 | Ohsawa | |
| 6,544,837 B1 | 4/2003 | Divakaruni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,556,477 B2 | 4/2003 | Hsu et al. | |
| 6,566,177 B1 | 5/2003 | Radens et al. | |
| 6,567,330 B2 | 5/2003 | Fujita et al. | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,627,952 B1 * | 9/2003 | Wollesen | 257/349 |
| 6,632,723 B2 | 10/2003 | Watanabe et al. | |
| 6,650,565 B1 | 11/2003 | Ohsawa | |
| 6,661,042 B2 | 12/2003 | Hsu | |
| 6,714,436 B1 | 3/2004 | Burnett et al. | |
| 6,721,222 B2 | 4/2004 | Somasekhar et al. | |
| 6,756,637 B2 * | 6/2004 | Adkisson et al. | 257/347 |
| 6,771,546 B2 | 8/2004 | Ikehashi et al. | |
| 6,778,424 B2 | 8/2004 | Iwata et al. | |
| 6,781,875 B2 | 8/2004 | Ohsawa | |
| 6,888,200 B2 * | 5/2005 | Bhattacharyya | 257/349 |
| 6,897,098 B2 | 5/2005 | Hareland et al. | |
| 6,903,984 B1 * | 6/2005 | Tang et al. | 365/149 |
| 6,909,151 B2 | 6/2005 | Hareland et al. | |
| 6,913,964 B2 | 7/2005 | Hsu | |
| 2001/0055859 A1 | 12/2001 | Yamada et al. | |
| 2002/0030214 A1 | 3/2002 | Horiguchi | |
| 2002/0034855 A1 | 3/2002 | Horiguchi et al. | |
| 2002/0036322 A1 | 3/2002 | Divakauni et al. | |
| 2002/0051378 A1 | 5/2002 | Ohsawa | |
| 2002/0064913 A1 | 5/2002 | Adkisson et al. | |
| 2002/0070411 A1 | 6/2002 | Vermandel et al. | |
| 2002/0072155 A1 | 6/2002 | Liu et al. | |
| 2002/0076880 A1 | 6/2002 | Yamada et al. | |
| 2002/0086463 A1 | 7/2002 | Houston et al. | |
| 2002/0089038 A1 | 7/2002 | Ning | |
| 2002/0098643 A1 | 7/2002 | Kawanaka et al. | |
| 2002/0110018 A1 | 8/2002 | Ohsawa | |
| 2002/0114191 A1 | 8/2002 | Iwata et al. | |
| 2002/0130341 A1 | 9/2002 | Horiguchi et al. | |
| 2002/0160581 A1 | 10/2002 | Watanabe et al. | |
| 2002/0180069 A1 | 12/2002 | Houston | |
| 2003/0003608 A1 | 1/2003 | Arikado et al. | |
| 2003/0015757 A1 | 1/2003 | Ohsawa | |
| 2003/0035324 A1 | 2/2003 | Fujita et al. | |
| 2003/0057487 A1 | 3/2003 | Yamada et al. | |
| 2003/0057490 A1 | 3/2003 | Nagano et al. | |
| 2003/0102497 A1 | 6/2003 | Fried et al. | |
| 2003/0112659 A1 | 6/2003 | Ohsawa | |
| 2003/0123279 A1 | 7/2003 | Aipperspach et al. | |
| 2003/0146488 A1 | 8/2003 | Nagano et al. | |
| 2003/0151112 A1 | 8/2003 | Yamada et al. | |
| 2003/0168677 A1 | 9/2003 | Hsu | |
| 2003/0213994 A1 | 11/2003 | Hayashi et al. | |
| 2004/0021137 A1 | 2/2004 | Fazan et al. | |
| 2004/0041206 A1 | 3/2004 | Bhattacharyya | |
| 2004/0041208 A1 | 3/2004 | Bhattacharyya | |
| 2004/0042268 A1 | 3/2004 | Bhattacharyya | |
| 2004/0052142 A1 | 3/2004 | Ikehashi et al. | |
| 2004/0108532 A1 | 6/2004 | Forbes | |
| 2004/0238890 A1 | 12/2004 | Fazan et al. | |
| 2004/0240306 A1 | 12/2004 | Fazan et al. | |
| 2005/0001269 A1 | 1/2005 | Hayashi et al. | |
| 2005/0062088 A1 | 3/2005 | Houston | |
| 2005/0064659 A1 | 3/2005 | Willer | |
| 2005/0105342 A1 | 5/2005 | Tang et al. | |
| 2005/0111255 A1 | 5/2005 | Tang et al. | |
| 2005/0135169 A1 | 6/2005 | Somasekhar et al. | |
| 2005/0141262 A1 | 6/2005 | Yamada et al. | |
| 2005/0141290 A1 | 6/2005 | Tang et al. | |

| | | | | | | |
|---|---|---|---|---|---|---|
| 2005/0145886 | A1 | 7/2005 | Keshavarzi et al. | JP | 62-272561 | 11/1987 |
| 2005/0145935 | A1 | 7/2005 | Keshavarzi et al. | JP | 02-294076 | 2/1991 |
| 2005/0167751 | A1 | 8/2005 | Nakajima et al. | JP | 3-171768 | 7/1991 |
| 2005/0189576 | A1 | 9/2005 | Ohsawa | JP | 8-213624 | 8/1996 |

FOREIGN PATENT DOCUMENTS

| | | |
|---|---|---|
| EP | 0 350 057 B1 | 1/1990 |
| EP | 0 354 348 A2 | 2/1990 |
| EP | 0 202 515 B1 | 3/1991 |
| EP | 0 207 619 B1 | 8/1991 |
| EP | 0 175 378 B1 | 11/1991 |
| EP | 0 253 631 B1 | 4/1992 |
| EP | 0 513 923 | 11/1992 |
| EP | 0 300 157 B1 | 5/1993 |
| EP | 0 564 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 A1 | 12/2001 |
| EP | 1 179 850 A2 | 2/2002 |
| EP | 1 180 799 | 2/2002 |
| EP | 1 191 596 A2 | 3/2002 |
| EP | 1 204 146 A1 | 5/2002 |
| EP | 1 204 147 A1 | 5/2002 |
| EP | 1 209 747 A2 | 5/2002 |
| EP | 0 744 772 B1 | 8/2002 |
| EP | 1 233 454 A2 | 8/2002 |
| EP | 0 725 402 B1 | 9/2002 |
| EP | 1 237 193 | 9/2002 |
| EP | 1 241 708 A2 | 9/2002 |
| EP | 1 253 634 A2 | 10/2002 |
| EP | 0 844 671 B1 | 11/2002 |
| EP | 1 271 547 | 1/2003 |
| EP | 1 280 205 | 1/2003 |
| EP | 1 288 955 | 3/2003 |
| FR | 2 197 494 | 3/1974 |
| GB | 1 414 228 | 11/1975 |
| JP | 8-274277 | 10/1996 |
| JP | 9-046688 | 2/1997 |
| JP | 9-82912 | 3/1997 |
| JP | 10-242470 | 9/1998 |
| JP | 11-087649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002-94027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| WO | WO 02/103703 | 12/2002 |

OTHER PUBLICATIONS

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effects in SOI MOS Transistors at Low Temperatures", Tack et al., IEEE Transactions on Electron Devices, vol. 37, No. 5, May 1990, pp. 1373-1382.

"Mechanisums of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003, (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIS, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 μm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Pepers (IEEE Cat No. 97TH8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

"Hot-Carrier Effect in Ultra-Thin-Film (UTF) Fully-Depleted SOI MOSFET's, Yu et al., 54th Annual Device Research Conference Digest (Cat. No. 96TH8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"Memory Design Using a One-Transistor Gain Cell on SOI", Ohsawa et al., IEEE Journal of Solid-State Circuits, vol. 37, No. 11, Nov. 2002, pp. 1510-1522.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

Fully Isolated Lateral Bipolar-MOS Transistors Fabricated in Zone-Melting-Recrystallized Si Films on SiO$_2$, Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"DRAM Design Using the Taper-Isolated Dynamic RAM Cell, Leiss et al.", IEEE Transactions on Electron Devices, vol. ED-29, No. 4, Apr. 1982, pp. 707-714.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Date Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

* cited by examiner

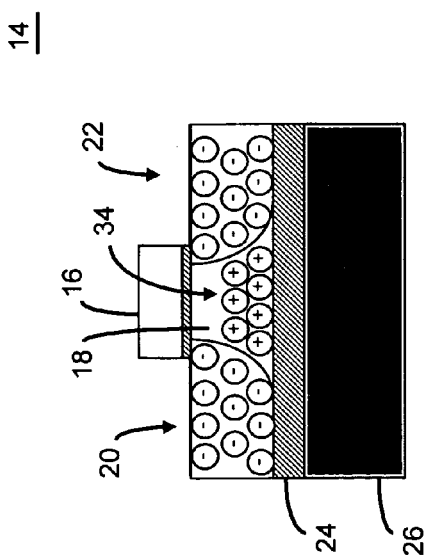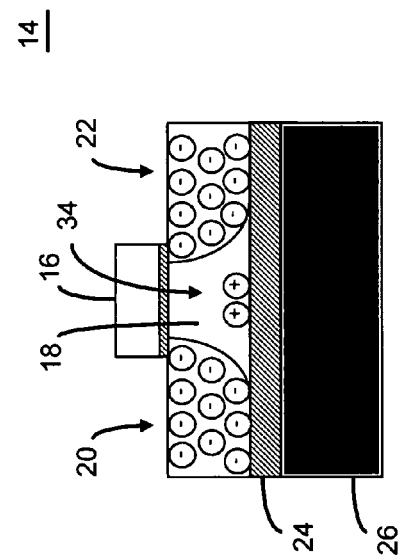

LOW POWER PROGRAMMING TECHNIQUE FOR A FLOATING BODY MEMORY TRANSISTOR, MEMORY CELL, AND MEMORY ARRAY

CROSS-REFERENCE TO RELATED APPLICATIONS

This application claims priority to: U.S. Provisional Application Ser. No. 60/505,679, entitled "Low Power Programming Technique for a One Transistor SOI Memory Device", filed Sep. 24, 2003 (hereinafter "the Provisional Application"). The contents of the Provisional Application are incorporated by reference herein in their entirety.

BACKGROUND

This invention relates to a semiconductor memory cell, array, architecture and device, and techniques for controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

There is a continuing trend to employ and/or fabricate advanced integrated circuits using techniques, materials and devices that improve performance, reduce leakage current and enhance overall scaling. Silicon-on-Insulator (SOI) is a material in which such devices may be fabricated on or in (hereinafter collectively "on"). Such devices are known as SOI devices and include, for example, partially depleted (PD), fully depleted (FD) devices, multiple gate devices (for example, double or triple gate), and Fin-FET. SOI devices have demonstrated improved performance (for example, speed), reduced leakage current characteristics and considerable enhancement in scaling.

One type of dynamic random access memory cell is based on, among other things, a floating body effect of SOI transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material/substrate). The insulation or non-conductive region may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

In one embodiment, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0". (See, FIG. 2B).

Several techniques may be implemented to read the data stored in (or write the data into) memory cells 12 of DRAM device 10. For example, a current sense amplifier (not illustrated) may be employed to read the data stored in memory cells 12. In this regard, a current sense amplifier may compare the cell current to a reference current, for example, the current of a reference cell (not illustrated). From that comparison, it may be determined whether memory cell 12 contained a logic high (relatively more majority carries 34 contained within body region 18) or logic low data state (relatively less majority carries 28 contained within body region 18).

Notably, for at least the purposes of this discussion, a logic high or State "1" corresponds to an increased concentration of majority carries in the body region relative to an unprogrammed device and/or a device that is programmed with a logic low or State "0". In contrast, a logic low or State "0" corresponds to a reduced concentration of majority carries in the body region relative to an unprogrammed device and/or a device that is programmed with a logic high or State "1".

With that in mind, a logic high may be written into an electrically floating body transistor of a memory cell using a number of techniques. For example, a logic high may be written by impact ionization or by using a band-to-band tunneling phenomenon (hereinafter "gate induced drain leakage" or "GIDL"). Briefly, for an N-channel type SOI memory cell, a State "1" may be stored in the memory cell by creating excess holes in the electrically floating body of transistor. These holes are believed to be created by a tunneling mechanism that appears in the silicon at the edge of the drain under specific conditions. As such, where a negative voltage is applied on the gate and a positive voltage is applied on the drain, this voltage difference may create a silicon band bending that then leads to a valence band electron tunneling into the conduction band. (See, FIGS. 3A and 3B). The GIDL effect or mechanism may be a very efficient manner of writing or storing a logic high (State "1") because it tends not to cause a channel to form in the body and, as such little to no channel current flows between the source and the drain. The GIDL technique of writing or storing a logic high (State "1") may reduce the current consumption relative to the impact ionization technique.

The TABLE 1 compares these two programming techniques or mechanisms.

TABLE 1

| | Mechanisms used to write State "1" | |
|---|---|---|
| | Channel impact ionization | Band to band tunneling (GIDL) |
| Power | SOI Device is ON: 10 to 100 µA/µm | SOI Device is OFF: low power |
| Scalability | Scalable for a few generations | More readily scalable |

Conventionally, a logic low or State "0" is written into a conventional SOI memory device while the device is in the "ON" State (for example, when the channel exists between the source and the drain). In particular, with reference to FIG. 4, conventional programming techniques for writing State "0" employ high voltage on the gate (i.e., a high gate voltage (Vg)) and a high voltage on the drain (i.e., a high drain voltage (Vd)) and, as such, the SOI memory device tends to consume and/or dissipate power (for example, approximately 200 µA/µm to approximately 800 µA/µm). Notably, State "1" is written into the SOI memory device via impact ionization.

While electrically floating body transistors of memory cells (for example, SOI transistors) of the type described above have low leakage current characteristics, such memory cells consume power when programming a logic low (i.e., removing charge carriers from the body of the SOI device). Moreover, given the need for a sufficiently large programming window (i.e., the difference in current level between a logic high and logic low), that consumption may be relatively large. As such, there is a need for high performance SOI memory cells, devices and arrays having improved performance characteristics (for example, speed and/or programming window, programming current consumption), reduced leakage current characteristics and/or considerably enhanced scaling and density capabilities.

SUMMARY OF THE INVENTION

There are many inventions described and illustrated herein. In a first principal aspect, the present invention is a dynamic random access memory cell for storing a first data state and a second data state, the memory cell comprising an electrically floating body transistor having a source region, a drain region, a body region disposed between the source region and the drain region, wherein the body region is electrically floating, and a gate spaced apart from, and capacitively coupled to, the body region. The electrically floating body transistor includes a first data state, which is representative of a first amount of majority carriers in the body region, and a second data state, which is representative of a second amount of majority carriers in the body region, wherein the first amount of majority carriers is less than the second amount of majority carriers.

The first data state is provided by applying a first voltage to the gate, a second voltage to the drain region, a third voltage to the source region such that, in response to the first, second and third voltages, majority carriers are removed from the body region through source region. In addition, the second voltage is greater than the first voltage and the absolute value of the difference between the first voltage and the third voltage is less than the absolute value of the threshold voltage of the electrically floating body transistor.

In one embodiment, the electrically floating body transistor is an N-channel type transistor. In another embodiment, the electrically floating body transistor is a P-channel type transistor.

Notably, the electrically floating body transistor may include a layout, a geometry or electrical characteristics that provides sufficient capacitive coupling between the drain and the floating body such that, in response to the first, second and third voltages, majority carriers are removed from the body region through source region.

In one embodiment, the absolute value of the difference between the first voltage and the third voltage is substantially less than the absolute value of the threshold voltage of the electrically floating body transistor. Indeed, in one embodiment, the first and third voltages are the same voltage. In another embodiment, the absolute value of the difference between the second voltage and the first voltage is greater than one volt.

The second data state, which is representative of a second amount of majority carriers in the body region, may be substantially provided by impact ionization. The second data state may also be substantially provided by band-to-band tunneling of majority carriers from the drain region to the body region.

In another principal aspect, the present invention is a dynamic random access memory cell for storing a first data state and a second data state. The memory cell comprises an electrically floating body transistor having a source region, a drain region, a body region disposed between the source region and the drain region, wherein the body region is electrically floating, and a gate spaced apart from, and capacitively coupled to, the body region. The electrically floating body transistor includes a first data state, which is representative of a first amount of majority carriers in the body region, and a second data state, which is representative of a second amount of majority carriers in the body region, wherein the first amount of majority carriers is less than the second amount of majority carriers.

The first data state, in this aspect of the invention, is provided by applying a first voltage to the gate, a second voltage to the drain region, a third voltage to the source region such that, in response to the first, second and third voltages, majority carriers are removed from the body region through drain region. Further, the third voltage is greater than the first voltage and the absolute value of the difference between the first voltage and the second voltage is less than the absolute value of the threshold voltage of the electrically floating body transistor.

In one embodiment, the electrically floating body transistor is an N-channel type transistor. In another embodiment, the electrically floating body transistor is a P-channel type transistor.

Notably, the electrically floating body transistor may include a layout, a geometry or electrical characteristics that provides sufficient capacitive coupling between the drain and the floating body such that, in response to the first, second and third voltages, majority carriers are removed from the body region through source region.

The difference between the first voltage and the second voltage may be substantially less than the threshold voltage of the electrically floating body transistor. Indeed, in at least one embodiment, the first and second voltages are the same voltage value. Further, the absolute value of the difference between the third voltage and the first voltage is greater than one volt.

The second data state, which is representative of a second amount of majority carriers in the body region, may be substantially provided by impact ionization or by band-to-band tunneling of majority carriers from the source region to the body region.

In another principal aspect, the present invention is a method of controlling a dynamic random access memory cell comprising an electrically floating body transistor having a source region, a drain region, a body region disposed between the source region and the drain region, wherein the body region is electrically floating; and a gate spaced apart from, and capacitively coupled to, the body region. The method comprises applying a first voltage to the gate, applying a second voltage to the drain region, and applying a third voltage to the source region, wherein the second voltage is greater than the first voltage and the difference between the first voltage and the third voltage is less than the threshold voltage of the electrically floating body transistor. In response to the first, second and third voltages, majority carriers are removed from the body region through source region to provide a first data state having a first amount of majority carriers in the body region, wherein the first data state is different than a second data state in that the first amount of majority carriers is less than the amount of majority carriers in the body region when the electrically floating body transistor is in the second data state.

In one embodiment, the difference between the first voltage and the second voltage is substantially less than the threshold voltage of the electrically floating body transistor. Notably, the first and third voltages may be the same voltage value. In another embodiment, the absolute value of the difference between the first voltage and the second voltage is greater than one volt.

The second data state of the electrically floating body transistor, which is representative of a second amount of majority carriers in the body region, is substantially provided by impact ionization or by band-to-band tunneling of majority carriers from the source region to the body region.

Again, there are many inventions described and illustrated herein. This Summary of the Invention is not exhaustive of the scope of the present invention. Moreover, this Summary of the Invention is not intended to be limiting of the invention and should not be interpreted in that manner. While certain embodiments, features, attributes and advantages of the inventions have been described in this Summary of the Invention, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 2A and 2B are exemplary schematic illustrations of the charge relationship, for a particular memory state, of the floating body, source and drain regions of a prior art memory cell comprised of one electrically floating body transistor (PD-SOI NMOS);

DETAILED DESCRIPTION

At the outset, it should be noted that there are many inventions described herein as well as many aspects and embodiments of those inventions. In a first aspect, the present invention is directed to a memory cell, architecture, and/or array and/or technique of writing or programming data into the memory cell (for example, a technique to write or program a logic low or State "0" in a memory cell employing an electrically floating body transistor. In this regard, the present invention programs a logic low or State "0" in the memory cell while the electrically floating body transistor is in the "OFF" state or substantially "OFF" state (for example, when the device has no (or practically no)

channel and/or channel current between the source and drain). In this way, the memory cell may be programmed whereby there is little to no current/power consumption by the electrically floating body transistor and/or from memory array having a plurality of electrically floating body transistors.

In one embodiment, the memory cell includes an electrically floating body transistor having a layout, a geometry (for example, the surface area of the drain-body interface relative to the gate-body area/interface) and/or electrical characteristics that provide sufficient capacitive coupling between the drain and the floating body such that when the voltage applied to the drain region (Vd) is increased, while the difference between the voltage applied to the gate is (Vg) and the voltage applied to the source (Vs) is less than the threshold voltage (Vt) of the transistor, majority carriers are removed from the floating body region. A memory cell including such a transistor may be characterized as a short channel ("SC") memory cell.

Figure 1A:
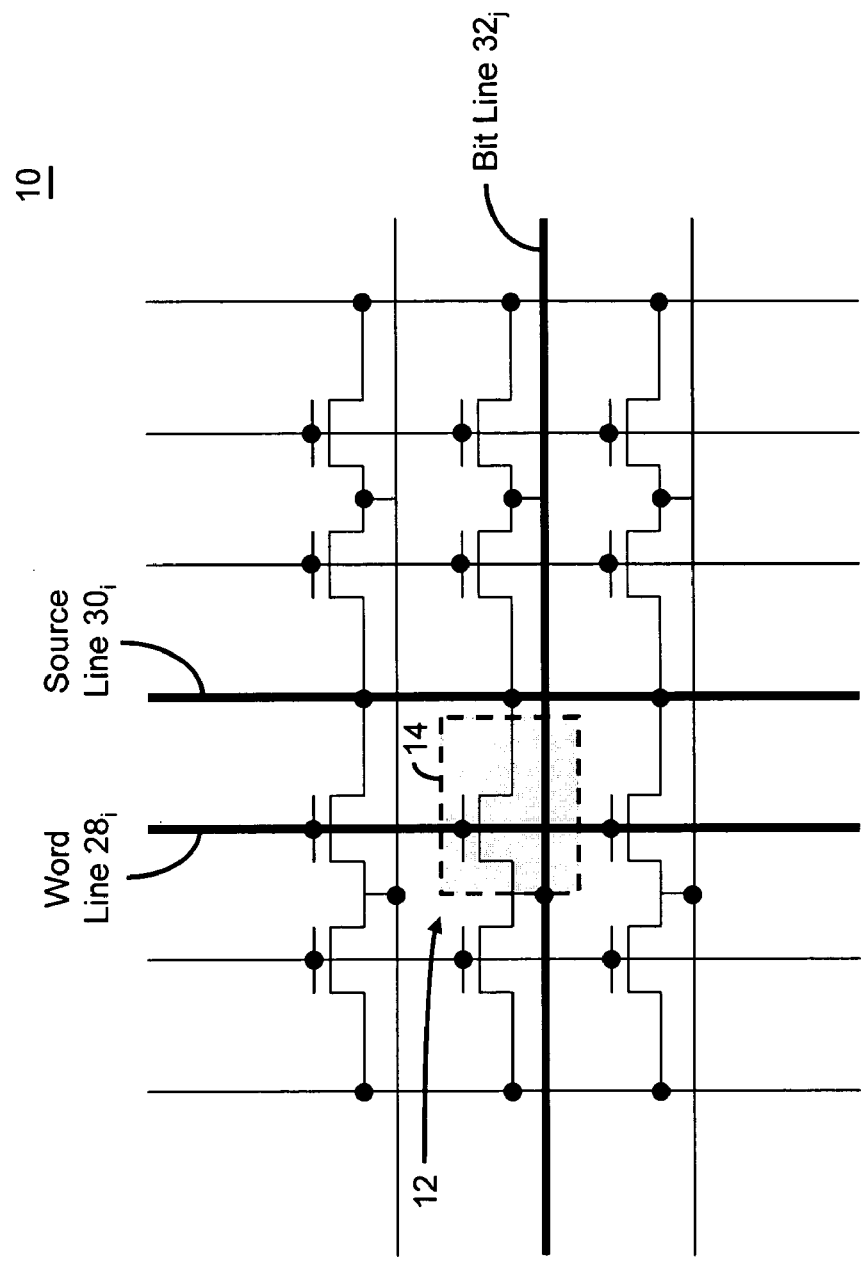
FIG. 1A is a schematic representation of a prior art semiconductor DRAM array including a plurality of memory cells comprised of one electrically floating body transistor.
Figure 1B:
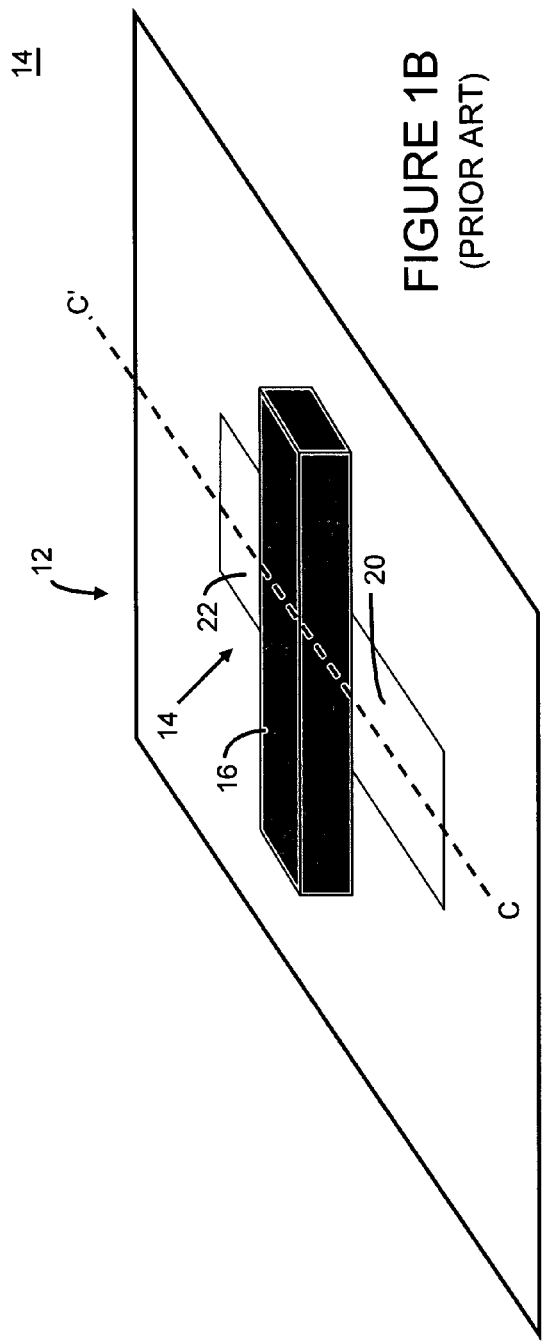
FIG. 1B is a three dimensional view of an exemplary prior art memory cell comprised of one electrically floating body transistor (PD-SOI NMOS)
Figure 1C:
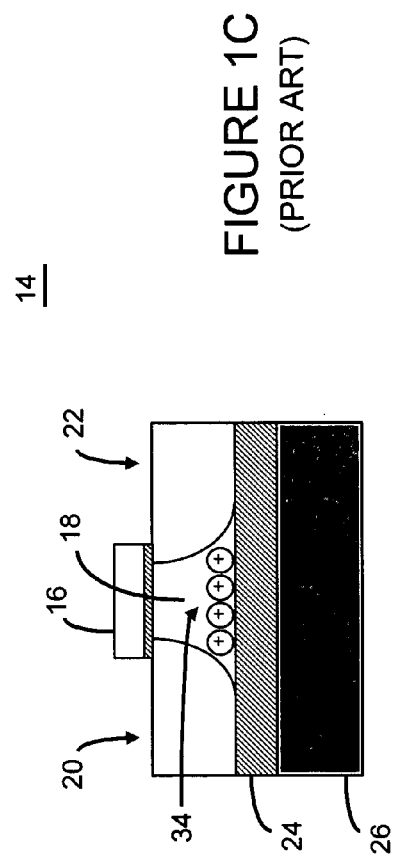
FIG. 1C is a cross-sectional view of the prior art memory cell of FIG. 1B, cross-sectioned along line C–C'.
Figure 3A:
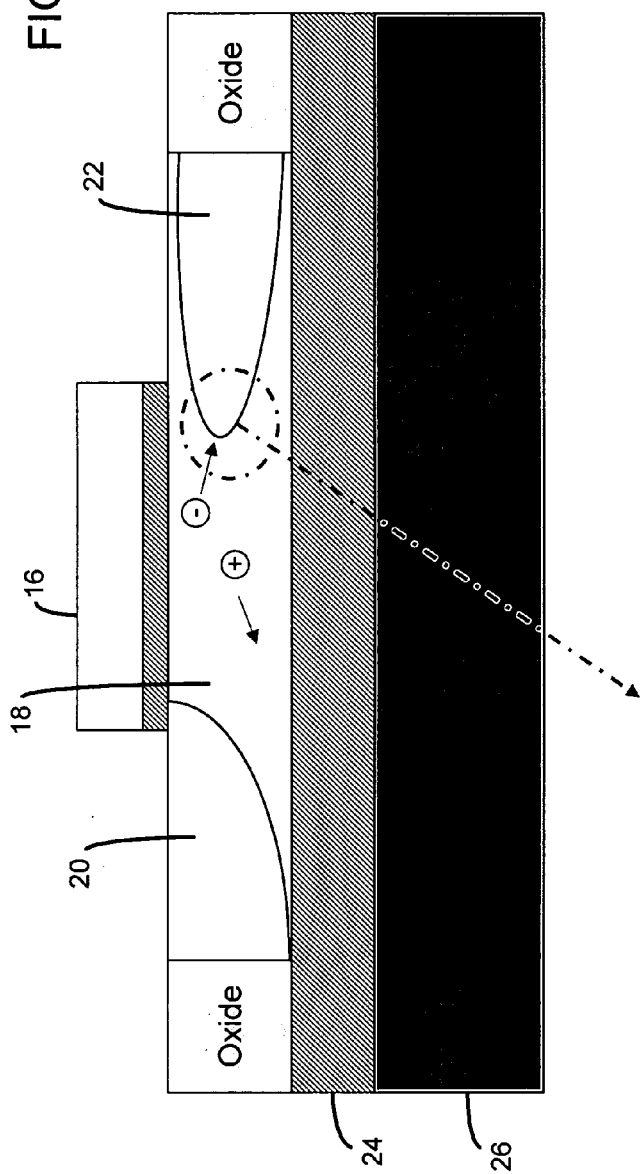
FIGS. 3A and 3B illustrate the GIDL mechanism for writing a logic high or State "1" into an electrically floating body transistor (for example, a PD-SOI NMOS)
Figure 3B:
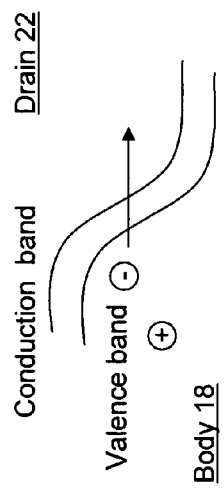
Figure 4:
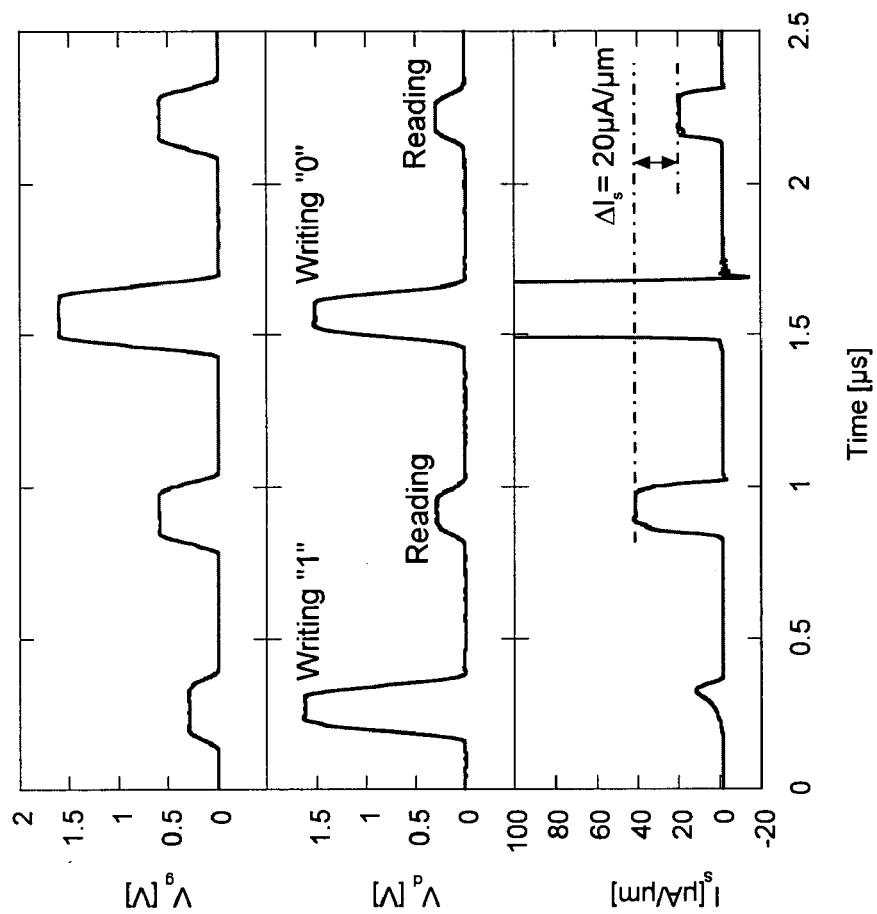
FIG. 4 is a graphical illustration of writing State "1" and State "0" into a one transistor SOI memory cell (for example, an SOI transistor fabricated using 130 nm FD SOI technology) wherein State "1" is written using an impact ionization technique and State "0" is written using high gate voltage (Vg) and high drain voltage (Vd)
Figure 5:
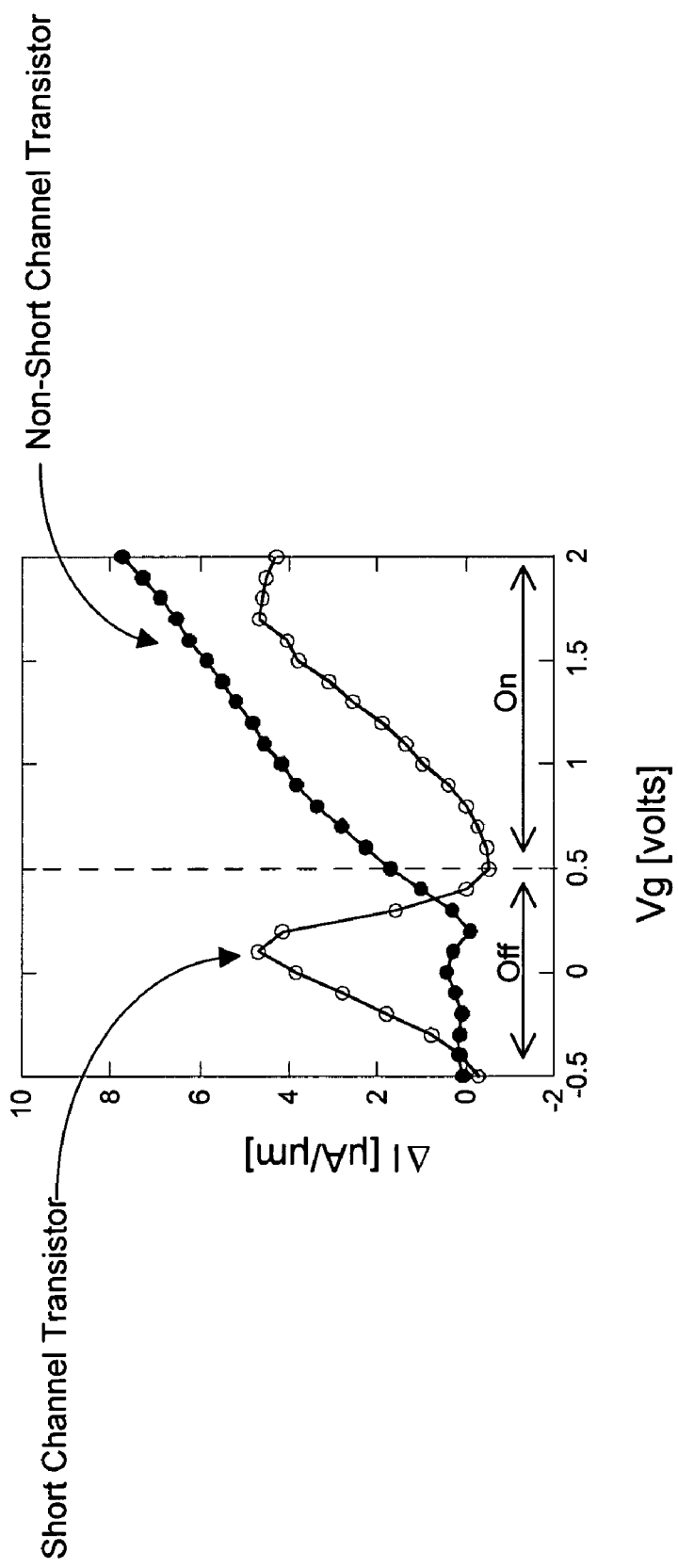
FIG. 5 is a graphical illustration of the current programming window ($\Delta$I) as a function of gate voltage (Vg), at a high drain voltage (Vd), for N-channel short channel and non-short channel SOI memory transistor; notably, the voltage applied to the source (Vs) is zero or ground)

For example, a logic low or State "0" may be written into the memory cell by applying a low gate-source voltage to the transistor comprising the memory cell, for example, at a voltage whereby the transistor remains in the "OFF" state or in a substantially "OFF" state. With reference to FIG. 5, applying low voltage to the gate such that the difference to the gate-source voltage (Vgs) is small (for example, (1) where there is no channel formation between the source and drain regions and/or (2a) in the context of an N-channel transistor, where the Vgs is less than the threshold voltage of the electrically floating body transistor of the memory cell is in the "OFF" state or essentially in the "OFF" state (for example, when there is little to no channel and/or channel current between the source and drain regions of the transistor) or (2b) in the context of a P-channel transistor, where the absolute value of Vgs is less than the transistor threshold voltage) the electrically floating body transistor of the memory cell is in the "OFF" state or essentially in the "OFF" state (for example, when there is little to no channel and/or channel current between the source and drain regions of the transistor).

Thus, in those situations where the memory transistor includes the drain-to-body capacitive coupling characteristics of a SC memory cell, writing or programming a State "0" or logic low may be accomplished when the electrically floating body transistor of the memory cell is in the "OFF" state or essentially in the "OFF" state. Notably, the electrically floating body transistor of the memory cell also includes an enhanced efficiency, relative to the programming window, at a low gate-source voltages (Vgs) in the context of N-channel transistors or at low gate-source voltages (Vgs) in the context of P-channel transistors (for example, when the absolute value of the gate-source voltage is less than the absolute value of the threshold voltage of the electrically floating body transistor of the memory cell; and, in this N-channel transistor example, when gate-source voltage (Vgs) is less than 0.25 volts (Vt>Vgs). Indeed, in this example, the SC memory cell includes a greater efficiency, relative to the programming window when the gate-source voltage (Vgs) is 0 volts or about 0 volts Notably, where the electrically floating body transistor of the memory cell lacks the drain-to-body capacitive coupling characteristics of a SC device, writing State "0" may require a high gate voltage-source (Vgs) (for example, greater than the transistor threshold voltage).

Figure 6:
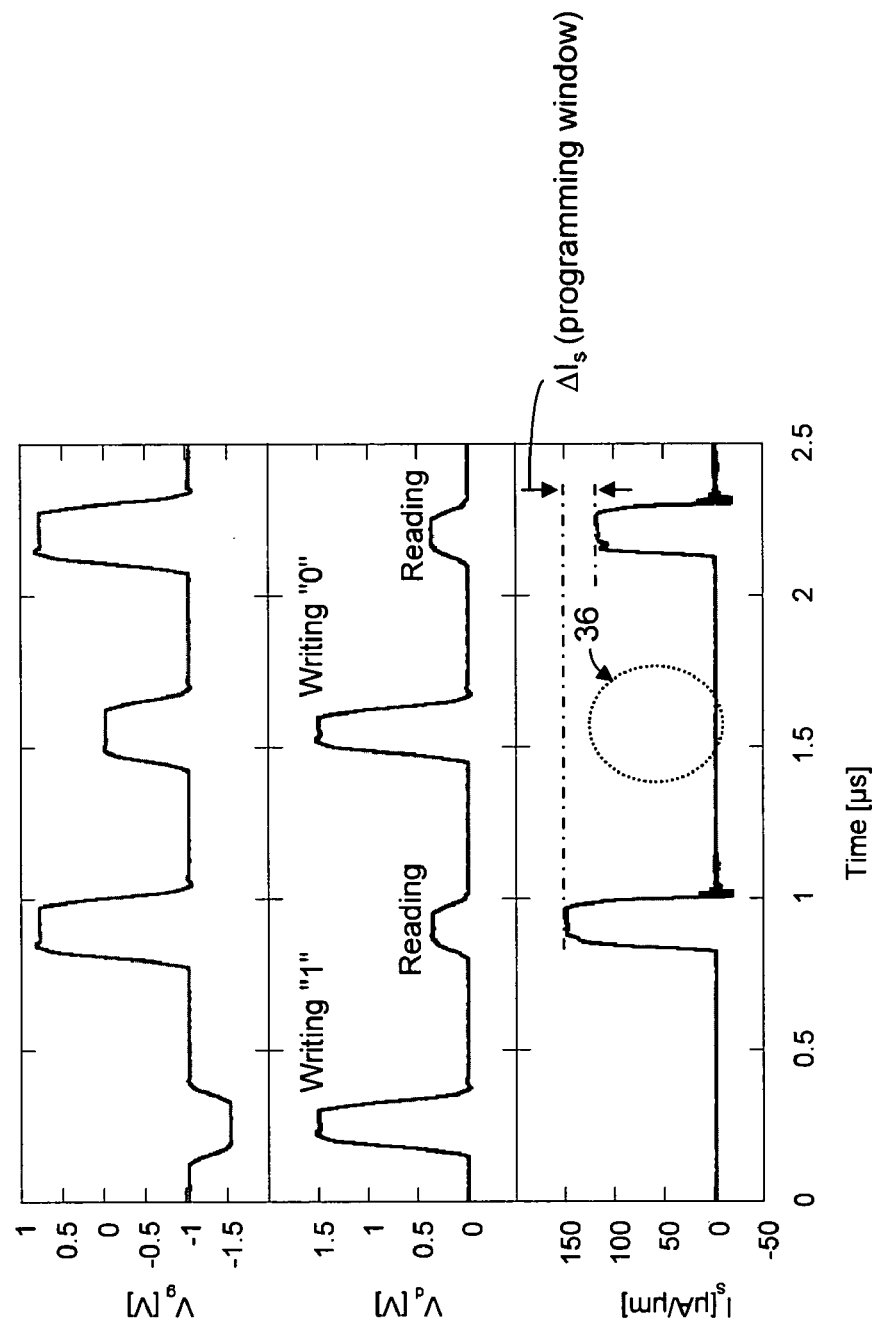
FIG. 6 is a graphical illustration of writing State "1" and State "0" into an SOI memory device (for example, an SOI memory transistor fabricated using 130 nm PD technology) wherein State "1" is written using GIDL technique and State "0" is written using a low voltage on the gate (i.e., a low gate voltage (Vg)) and a high drain voltage (Vd); notably, the voltage applied to the source (Vs) is zero or ground)

With reference to FIG. 6, the writing, programming and/or control technique, according to the present invention, employs a low gate-source voltage (Vgs) and a high drain voltage (Vd) to write State "0" in the electrically floating body transistor of the memory cell. In one embodiment, State "0" is written and/or programmed into the electrically floating body transistor of the memory cell while the transistor is "OFF", essentially "OFF" or substantially "OFF" since it consumes essentially no power (i.e., little to no power). (See, dotted area 36 in FIG. 6). In this way, the power consumption of the memory cell is considerably less than the consumption observed using other programming techniques.

Notably, the present invention may be implemented using any technique or operation to write or store a logic high or State "1" in the electrically floating body transistor of the memory cell. For example, impact ionization or GIDL techniques may be employed when writing or storing State "1". Indeed, any technique, whether now known or later developed may be employed to write or store a logic high or State "1" in the electrically floating body transistor of the memory cell.

Moreover, the present invention may be implemented using programming techniques whereby the majority carriers are removed from the source and/or drain regions. For example, in one embodiment, all or substantially all of the majority carriers are removed from the source region. In this embodiment, a logic low or State "0" (i.e., majority carriers are removed from the body) is written or programmed into the electrically floating body transistor of the memory cell by applying a low gate-source voltage (Vgs) to the electrically floating body transistor of the memory cell—that is, (1) where there is no channel formation between the source and drain regions of the transistor and/or (2a) where the gate-source voltage (Vgs), in the context of an N-channel transistor, is less than (or substantially less than) the threshold voltage of the transistor or (2b) where the gate-source voltage (Vgs), in the context of an P-channel transistor, is greater than the threshold voltage of the transistor (i.e., the gate-source voltage is less negative than the threshold voltage). In one embodiment, all or substantially all of the majority carriers are removed from the source region.

Figure 7A:
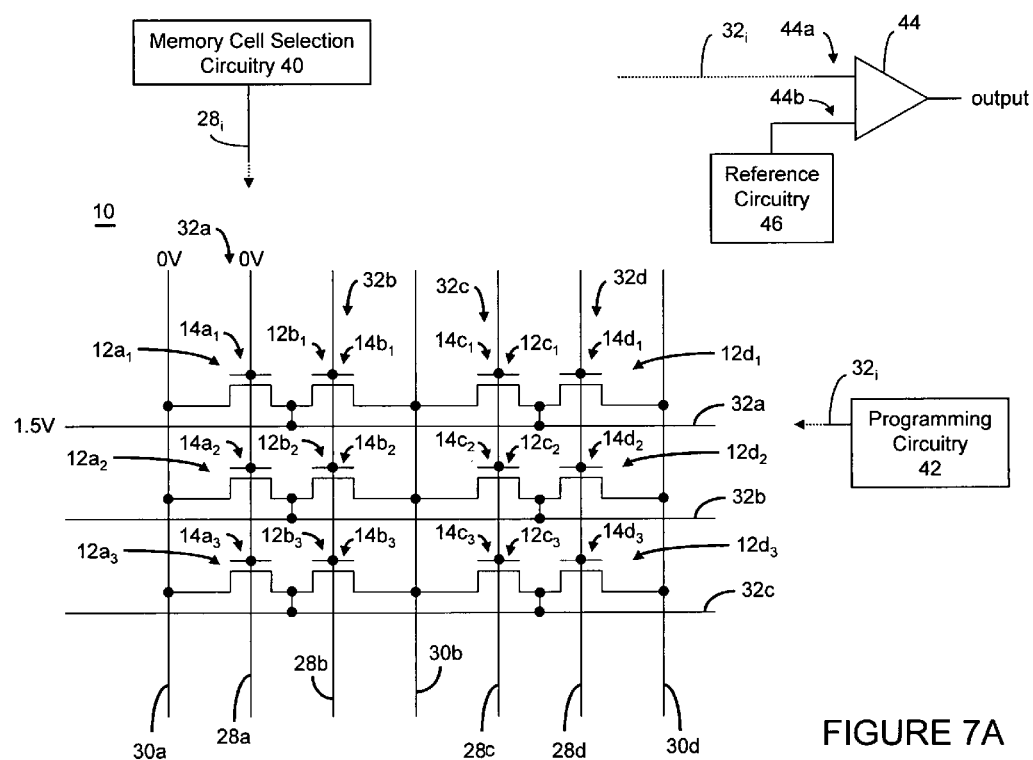
FIG. 7A illustrates a memory array including a plurality of memory cells, each including one electrically floating body transistor having a shared drain region (and bit line) and a common word line, which defines a particular row of memory cells, and exemplary writing and/or programming techniques (including exemplary programming voltage values for a logic low or State "0") according to one embodiment of the present invention.

Thus, a logic low or State "0" may be programmed into an N-channel electrically floating body transistor of the memory cell by applying a high voltage to the drain region (Vd) (for example, greater than or equal to 0.5 volts, preferably greater than or equal to 1 volt, and more preferably greater than or equal to 1.5 volts) and maintaining or applying a low voltage on the gate (i.e., a low gate voltage (Vg) such that Vgs is less than the threshold voltage of the transistor). (See, for example, transistor 14$a_1$ of memory cell 12$a_1$ in FIG. 7A). In this regard, the electrically floating body transistor of the memory cell may have sufficient capacitive coupling between its drain and the floating body such that by applying a high drain voltage and a low gate voltage, the majority carriers in the body are removed from the source and/or drain of the device. Again, in this exemplary embodiment, the majority carriers in the body are removed from the source region of the transistor.

The read and write operations may be performed by controlling the amplitude and timing of the voltages applied to the gate, drain region and source region of electrically floating body transistor 14. For example, with reference to FIG. 7A, memory cell 12$a_1$ may be programmed when word line 28$a$ and bit line 32$a$ are selected, via memory cell selection circuitry 40 and programming circuitry 42, respectively. In this regard, memory cell selection circuitry 40 applies a low voltage on the gate (i.e., a low gate voltage (Vg) such that Vgs is less than the threshold voltage of the transistor, for example, 0 volts). In addition, in one exemplary embodiment, memory cell selection circuitry 40 applies a sufficiently high voltage (1.5v), in the case of an N-channel transistor, on bit line 28a. In this way, a logic low or State "0" (i.e., majority carriers are removed from the electrically floating body region through the source region) is written or programmed into transistor 14$a_1$ of the memory cell 12$a_1$.

Notably, where memory cell 12 is one of many or a plurality of memory cells in memory array 10, memory cell selection circuitry 40 may be a conventional word line and bit line decoder or driver. Moreover, pass gates and/or column switch circuitry (not illustrated) may be employed to selectively connect transistor 14$a_1$ to programming circuitry 40 to facilitate and/or implement the programming operation of memory cell 12$a_1$. Indeed, there are many different control/selection techniques (and circuitry therefor) to implement the read and write operations. All such control/selection techniques and circuitry therefor, whether now known or later developed, are intended to fall within the scope of the present invention.

Briefly, to perform a read operation, sense amplifier 44 (for example, a conventional cross-coupled sense amplifier) is connected to bit lines 32 to detect, determines, sense and/or sample the data state of memory cell 12. In one embodiment, sense amplifier 44 detects the data state of memory cell 12 by comparing the voltages or currents applied to inputs 44a and 44b. The voltage or current applied to input 44a of sense amplifier 44 will depend, to a large extent, on the threshold voltage of the transistor 14 of the selected memory cell 12. The voltage applied to input 44b will depend on the reference voltage that is provided or output by reference circuitry 46.

In one embodiment, reference circuitry 46 may be a voltage reference or a current source. Where reference circuitry 46 is a current source, the output current of the current source should provide an appropriate voltage or current at input 44b of sense amplifier 44 to permit sense amplifier 44 to detect the data state of memory cell 12. That is, in one embodiment, the amount of current output would be between the amount of current equivalent to a high data state and a low data state of a typical electrically floating body transistor 14 of a typical memory cell 12. In a preferred embodiment, the amount of current is substantially equal to one-half of the sum of the amount of current equivalent to a high data state and a low data state of a typical electrically floating body transistor 14.

In another embodiment, reference circuitry 46 includes at least two reference memory cells (not illustrated), each including an electrically floating body transistor. In this embodiment, one of the reference memory cells is programmed to a high data state and one of the reference memory cells is programmed to a low data state. The reference circuitry 46, in one embodiment, provides a voltage at input 44b that is substantially equal to one-half of the sum of the two reference memory cells. The memory cell 10 is read by coupling the drain region of the electrically floating body transistor 14 of the selected memory cell 12 to input 44a and the reference voltage generated by reference circuitry 46 to input 44b.

It may be advantageous to employ the reference memory cells configuration described above in order to track and/or address variations in the memory cell characteristics due to changes in operating conditions (for example, temperature variations and/or power variations).

Thus, the circuitry employed to read the data state of memory cell 10 (for example, sense amplifier 44 and reference circuitry 46) may sense the data state stored in memory cell 10 using voltage or current sensing techniques. Such circuitry and configurations thereof are well known in the art. Indeed, any circuitry or architecture to sense, sample, detect or determine the data state of memory cell 12, whether now known or later developed, is intended to be within the scope of the present invention.

In one embodiment, the source regions of the electrically floating body transistors 14 of the memory cells 12 may be coupled to a stable reference voltage (for example, a ground potential or zero volts) generated by a reference voltage generator (not illustrated). In other embodiments, the source regions of the electrically floating body transistors 14 of the memory cells 12 may be coupled to certain control signals having well defined voltage levels and timing characteristics. (See, for example, the embodiment of FIG. 7B)

Notably, pass gates and/or column switch circuitry (not illustrated) may be employed to selectively connect electrically floating body transistors 14 to sense amplifier 44 to facilitate and/or implement the read and write operations of the data state of memory cell 12.

In sum, certain advantages of the State "0" programming technique and the electrically floating body transistor of memory cell (for example, the SOI transistor memory cell) of the present invention include: (1) low power consumption, (2) enhanced scalability and (3) a relatively large programming window (for example, as illustrated in FIG. 6, $\Delta I_s$=30 µA/µm).

Notably, while a significant portion of this description includes details (for example, write/programming and/or read voltages) directed to N-channel transistors, the inventions (and embodiments thereof described herein are entirely applicable to P-channel transistors, as described above. In such embodiments, majority carriers 34 in body region 18 are electrons and minority carriers are holes and the voltages applied to the gate, source region and drain region may be negative.

Moreover, the memory arrays may be comprised of N-channel, P-channel and/or both types of transistors. Indeed, the circuitry that is peripheral to the memory array (for example, sense amplifiers or comparators, row, and column address decoders, as well as line drivers (all not illustrated herein)) may include P-channel and/or N-channel type transistors, including short channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, the electrically floating body transistor, which is programmed to a logic low or State "0" according to the techniques of the present invention, may be employed in any memory cell, architecture, layout, structure and/or configuration. In this regard, such a transistor may be implemented in the memory cell, architecture, layout, structure and/or configuration described and illustrated in the following non-provisional U.S. patent applications:

(1) application Ser. No. 10/450,238, which was filed by Fazan et al. on Jun. 10, 2003 and entitled "Semiconductor Device";

(2) application Ser. No. 10/487,157, which was filed by Fazan et al. on Feb. 18, 2004 and entitled "Semiconductor Device";

(3) application Ser. No. 10/829,877, which was filed by Ferrant et al. on Apr. 22, 2004 and entitled "Semiconductor Memory Cell, Array, Architecture and Device, and Method of Operating Same"; and (4) application Ser. No. 10/840,009, which was filed by Ferrant et al. on May 6, 2004 and entitled "Semiconductor Memory Device and Method of Operating Same".

The entire contents of these non-provisional U.S. patent applications, including, for example, the inventions, features, attributes, architectures, configurations, materials, techniques and advantages described and illustrated therein, are hereby incorporated by reference herein.

Figure 7B:
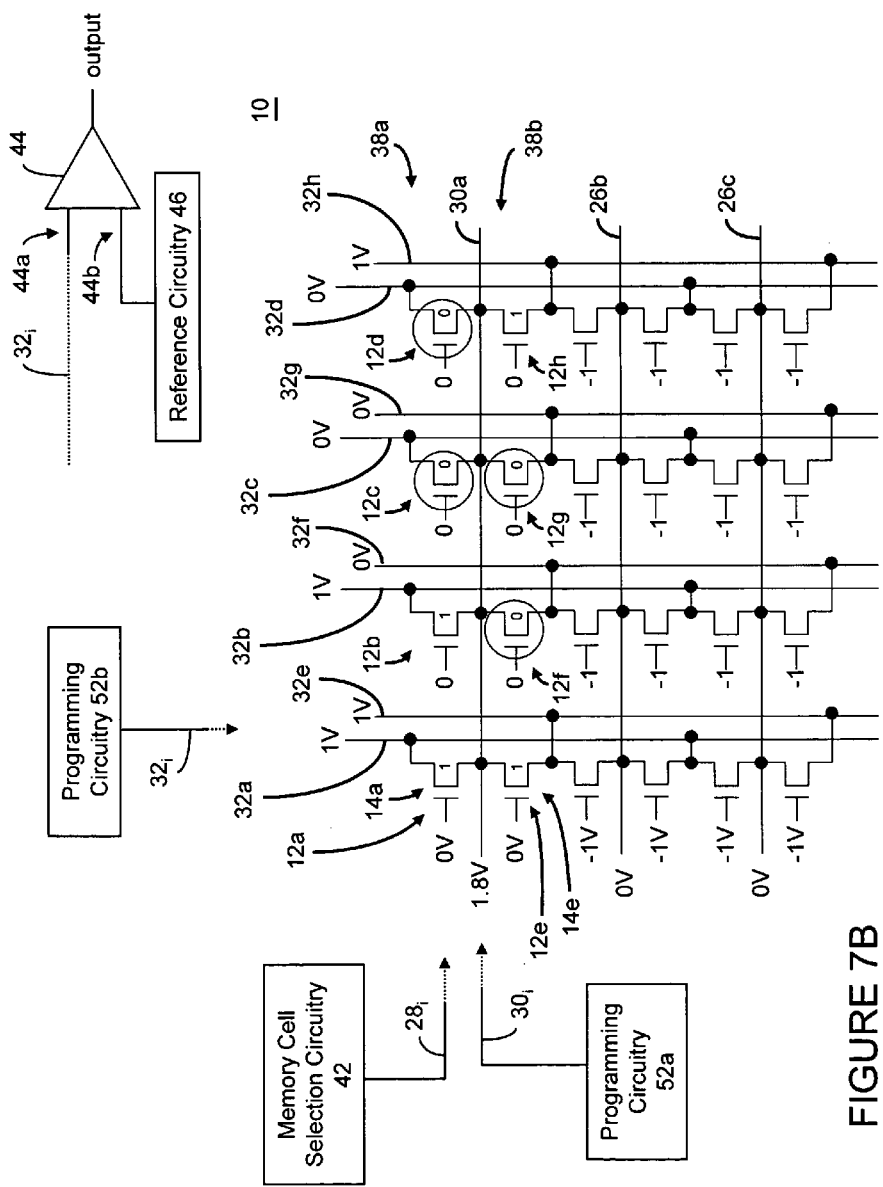
FIG. 7B illustrates a memory array including a plurality of memory cells, each having an electrically floating body transistor, configured in a common source line array and having common word lines, which defines a particular row of memory cells, and exemplary writing and/or programming techniques (including exemplary programming voltage values for a logic low or State "0") according to one embodiment of the present invention.

For example, with reference to FIG. 7B, one some or all of memory cells 12 of adjacent rows 38a and 38b may be programmed to a logic low or State "0" using the techniques of the present invention. In this exemplary embodiment, memory array 10 includes a plurality of memory cells 12, each have an electrically floating body transistor 14. The memory cells 12a–d of row 38a "share" source line 30a with memory cells 12e–h of row 38b. In this embodiment, the voltages applied to the gate and the drain provides a differential that is less than Vt of the transistor (in this exemplary embodiment, Vgd=0v). As such, no channel forms between the source and drain of transistor 14 of memory cells 12. The writing or programming a logic low of State "0" into selected memory cells 12c, 12d, 12f and 12g of the architecture of this exemplary memory array is accomplished by applying a write logic low voltage to source line 30a relative to the voltage applied to the gates of the transistors of memory cells 12a–d and 12e–h (in this exemplary embodiment, Vs=1.8v and Vg=0v), via a common word line. Notably, in this exemplary embodiment, the majority carriers in the body are ejected or removed from the drain region of the selected transistors.

Moreover, by applying respective inhibit voltages to selected bit lines memory cells 12a, 12b, 12e and 12h (which are associated or connected to selected bit lines 32a–32h) maintain their data states and, as such, their data states are not affected by the programming of logic low or State "0" in memory cells 12c, 12d, 12f and 12g of rows 38a and 38b.

Notably, the memory cells may be controlled (for example, programmed, inhibited or read) using memory selection circuitry 40, programming circuitry 42, sense amplifier 44 and reference circuitry 46, as described above, as well as using any of the control/operation techniques described and illustrated in the above-referenced four (4) non-provisional U.S. patent applications. For the sake of brevity, those discussions will not be repeated; such control/operation techniques are incorporated herein by reference.

Figure 8:
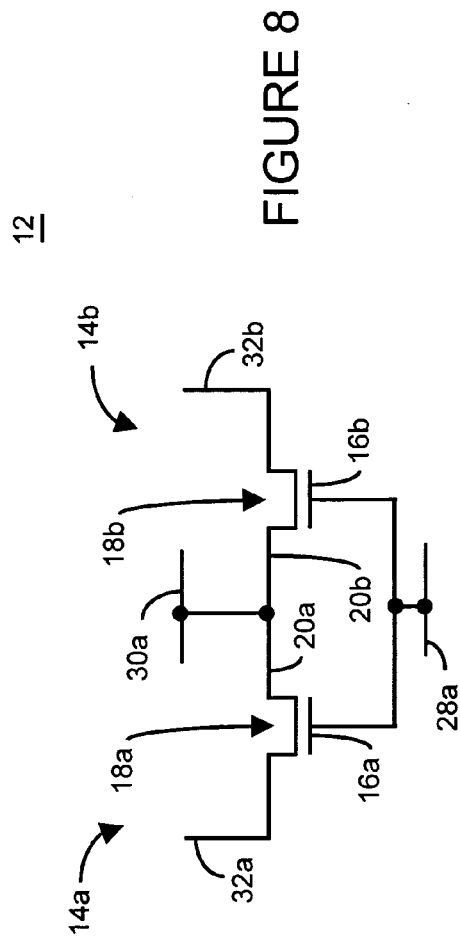
FIG. 8 illustrates a memory cell including two electrically floating body transistors that are configured to have a common source region and connected gates, that may be controlled, programmed and/or operated according to one embodiment of the techniques of the present invention.

It should be further noted that while each memory cell 12 in the exemplary embodiments includes one transistor 14, memory cell 12 may include two transistors 14a and 14b, as described and illustrated in application Ser. No. 10/829,877, which was filed by Ferrant et al. on Apr. 22, 2004 and entitled "Semiconductor Memory Cell, Array, Architecture and Device, and Method of Operating Same". In this regard, with reference to FIG. 8, two-transistor memory cell 12 includes transistors 14a and 14b which store complementary data states. In one embodiment, transistors 14a and 14b of memory cell 12 include a layout whereby transistors 14a and 14b include (1) common source regions 20a and 20b, respectively, and (2) gates 16a and 16b, respectively, that are connected to the same word line 28.

Figure 9B:
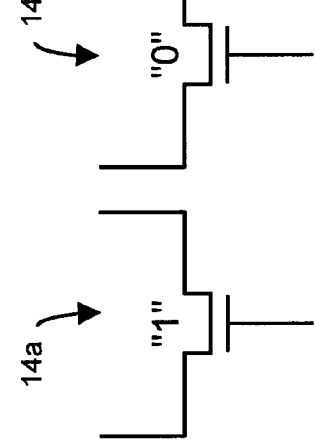
FIGS. 9A and 9B illustrate the two data states of the memory cell having two electrically floating body transistors of, for example, FIG. 8.
Figure 9A:
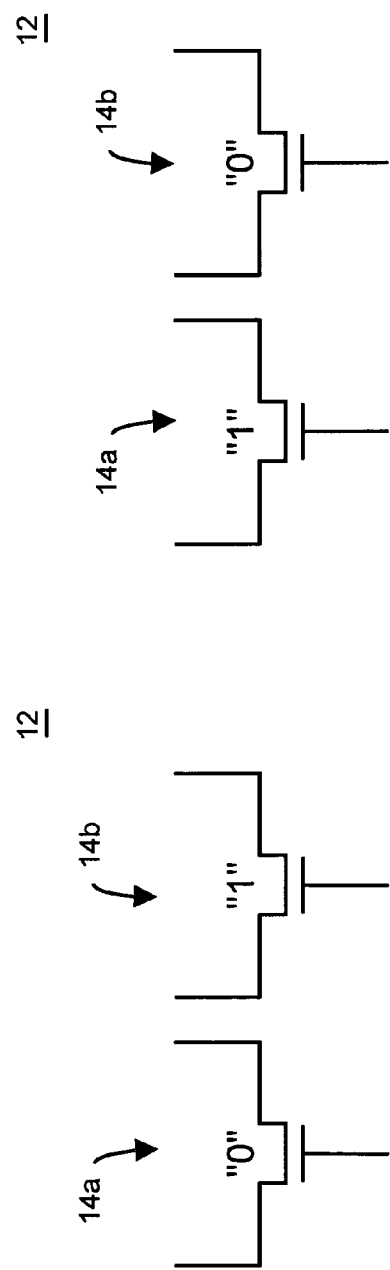

With reference to FIGS. 9A and 9B, in operation, two-transistor memory cell 12 includes first transistor 14a that maintains a complementary state relative to second transistor 14b. As such, when programmed, one of the transistors of the memory cell stores a logic low (a binary "0") and the other transistor of the memory cell stores a logic high (a binary "1"). The transistor 14 that is programmed to a logic low or State "0" may be programmed according to the techniques of the present invention. That is, transistor 14 of memory cell 12 may be programmed to a logic low or State "0" (i.e., majority carriers are removed from the body) by applying a low gate-source voltage (Vgs) to the electrically floating body transistor of the memory cell. In this way, little to no channel is formed between the source and drain regions of the transistor in the transistor 14 that is programmed to a logic low or State "0" (the gate-source voltage (Vgs), in the context of an N-channel transistor, is less than the threshold voltage of the transistor or the gate-source voltage (Vgs), in the context of an P-channel transistor, is greater than the threshold voltage (Vt) of the transistor (i.e., Vgs is less negative than the Vt).

As mentioned above, any of the architectures, layouts, structures and/or configurations, as well as the programming and reading operations described and illustrated in application Ser. No. 10/829,877, which was filed by Ferrant et al. on Apr. 22, 2004 and entitled "Semiconductor Memory Cell, Array, Architecture and Device, and Method of Operating Same" may be employed in conjunction with the inventions described and illustrated herein. For the sake of brevity, those discussions will not be repeated; rather, they are incorporated by reference herein.

The electrically floating memory cells, SC transistors and/or memory array(s) may be fabricated using well known techniques and/or materials. Indeed, any fabrication technique and/or material, whether now known or later developed may be employed to fabricate the electrically floating memory cells, SC transistors and/or memory array(s). For example, the present invention may employ silicon (whether bulk-type or SOI, as described above), germanium, silicon/germanium, and gallium arsenide or any other semiconductor material in which transistors may be formed. Indeed, the electrically floating memory cells, SC transistors and/or memory array(s) may employ the techniques described and illustrated in non-provisional patent application entitled "Integrated Circuit Device, and Method of Fabricating Same", which was filed on Jul. 2, 2004, by Fazan, and assigned Ser. No. 10/884,481 (hereinafter "Integrated Circuit Device Patent Application"). The entire contents of the Integrated Circuit Device Patent Application, including, for example, the inventions, features, attributes, architectures, configurations, materials, techniques and advantages described and illustrated therein, are hereby incorporated by reference herein.

Indeed, the memory array 10 (including SOI memory transistors) may be integrated with SOI logic transistors, as described and illustrated in the Integrated Circuit Device Patent Application. For example, in one embodiment, an integrated circuit device includes memory section (having, for example, PD or FD SOI memory transistors 14) and logic section having, for example, high performance transistors, such as Fin-FET, multiple gate transistors, and/or non-high performance transistors (for example, single gate transistors that do not possess the performance characteristics of high performance transistors—not illustrated). Again, the entire contents of the Integrated Circuit Device Patent Application, including, for example, the inventions, features, attributes, architectures, configurations, materials, techniques and advantages described and illustrated therein, are hereby incorporated by reference.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

The above embodiments of the present invention are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present invention. As such, the foregoing description of the exemplary embodiments of the invention has been presented for the purposes of illustration and description. Many modifications and variations are possible in light of the above teaching. It is intended that the scope of the invention not be limited solely to this detailed description but be measured by the claims, which follow.

What is claimed is:

1. A dynamic random access memory cell for storing a first data state and a second data state, the memory cell comprising:
    an electrically floating body transistor having:
        a source region;
        a drain region;
        a body region disposed between the source region and the drain region,
    wherein the body region is electrically floating; and
        a gate spaced apart from, and capacitively coupled to, the body region;
    wherein the electrically floating body transistor includes a first data state representative of a first amount of majority carriers in the body region, and a second data state representative of a second amount of majority carriers in the body region, wherein the first amount of majority carriers is less than the second amount of majority carriers;
    wherein the first data state is provided by applying a first voltage to the gate, a second voltage to the drain region, a third voltage to the source region such that, in response to the first, second and third voltages, majority carriers are removed from the body region through source region; and
    wherein the second voltage is greater than the first voltage and the absolute value of the difference between the first voltage and the third voltage is less than the absolute value of the threshold voltage of the electrically floating body transistor.

2. The dynamic random access memory cell of claim 1 wherein the electrically floating body transistor is an N-channel type transistor.

3. The dynamic random access memory cell of claim 1 wherein the electrically floating body transistor is a P-channel type transistor.

4. The dynamic random access memory cell of claim 1 the electrically floating body transistor includes a layout, a geometry or electrical characteristics that provides sufficient capacitive coupling between the drain and the body regions such that, in response to the first, second and third voltages, majority carriers are removed from the body region through source region.

5. The dynamic random access memory cell of claim 1 wherein the absolute value of the difference between the first voltage and the third voltage is substantially less than the absolute value of the threshold voltage of the electrically floating body transistor.

6. The dynamic random access memory cell of claim 1 wherein the absolute value of the difference between the second voltage and the first voltage is greater than one volt.

7. The dynamic random access memory cell of claim 1 wherein the second data state, which is representative of a second amount of majority carriers in the body region, is substantially provided by impact ionization.

8. The dynamic random access memory cell of claim 1 wherein the first and third voltages are the same voltage.

9. The dynamic random access memory cell of claim 1 wherein the second data state is substantially provided by band-to-band tunneling of majority carriers from the drain region to the body region.

10. A dynamic random access memory cell for storing a first data state and a second data state, the memory cell comprising:
    an electrically floating body transistor having:
        a source region;
        a drain region;
        a body region disposed between the source region and the drain region,
    wherein the body region is electrically floating; and
        a gate spaced apart from, and capacitively coupled to, the body region;
    wherein the electrically floating body transistor includes a first data state representative of a first amount of majority carriers in the body region, and a second data state representative of a second amount of majority carriers in the body region, wherein the first amount of majority carriers is less than the second amount of majority carriers;
    wherein the first data state is provided by applying a first voltage to the gate, a second voltage to the drain region, a third voltage to the source region such that, in response to the first, second and third voltages, majority carriers are removed from the body region through drain region; and
    wherein the third voltage is greater than the first voltage and the absolute value of the difference between the first voltage and the second voltage is less than the absolute value of the threshold voltage of the electrically floating body transistor.

11. The dynamic random access memory cell of claim 10 wherein the electrically floating body transistor is an N-channel type transistor.

12. The dynamic random access memory cell of claim 10 wherein the electrically floating body transistor is a P-channel type transistor.

13. The dynamic random access memory cell of claim 10 the electrically floating body transistor includes a layout, a geometry or electrical characteristics that provides sufficient capacitive coupling between the drain and the body regions such that, in response to the first, second and third voltages, majority carriers are removed from the body region through drain region.

14. The dynamic random access memory cell of claim 10 wherein the absolute value of the difference between the first voltage and the second voltage is substantially less than the absolute value of the threshold voltage of the electrically floating body transistor.

15. The dynamic random access memory cell of claim 10 wherein the absolute value of the difference between the third voltage and the first voltage is greater than one volt.

16. The dynamic random access memory cell of claim 10 wherein the second data state, which is representative of a second amount of majority carriers in the body region, is substantially provided by impact ionization.

17. The dynamic random access memory cell of claim 10 wherein the first and second voltages are the same voltage value.

18. The dynamic random access memory cell of claim 10 wherein the second data state is substantially provided by band-to-band tunneling of majority carriers from the source region to the body region.

19. A method of controlling a dynamic random access memory cell comprising an electrically floating body transistor having a source region, a drain region, a body region disposed between the source region and the drain region, wherein the body region is electrically floating; and a gate spaced apart from, and capacitively coupled to, the body region, the method comprising:
applying a first voltage to the gate;
applying a second voltage to the drain region;
applying a third voltage to the source region, wherein the absolute value of the second voltage is greater than the absolute value of the first voltage and the absolute value of the difference between the first voltage and the third voltage is less than the absolute value of the threshold voltage of the electrically floating body transistor; and
wherein, in response to the first, second and third voltages, majority carriers are removed from the body region through source region to provide a first data state having a first amount of majority carriers in the body region, wherein the first data state is different than a second data state of the electrically floating body transistor in that the first amount of majority carriers is less than the amount of majority carriers in the body region when the electrically floating body transistor is in the second data state.

20. The method of claim 19 wherein the difference between the first voltage and the second voltage is substantially less than the threshold voltage of the electrically floating body transistor.

21. The method of claim 19 wherein the absolute value of the difference between the first voltage and the second voltage is greater than one volt.

22. The method of claim 19 wherein the second data state which is representative of a second amount of majority carriers in the body region is substantially provided by impact ionization.

23. The method of claim 19 wherein the first and third voltages are the same voltage value.

24. The method of claim 19 wherein the second data state is substantially provided by band-to-band tunneling of majority carriers from the source region to the body region.

* * * * *